US010349049B2

(12) United States Patent
Tsutsumi et al.

(10) Patent No.: US 10,349,049 B2
(45) Date of Patent: Jul. 9, 2019

(54) INSPECTING ORGANIC TFT ARRAY USING DIFFERENTIAL IMAGE

(71) Applicant: NATIONAL INSTITUTE OF ADVANCED INDUSTRIAL SCIENCE AND TECHNOLOGY, Tokyo (JP)

(72) Inventors: Junya Tsutsumi, Tsukuba (JP); Satoshi Matsuoka, Tsukuba (JP); Toshikazu Yamada, Nagoya (JP); Tatsuo Hasegawa, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 64 days.

(21) Appl. No.: 15/502,975

(22) PCT Filed: Aug. 11, 2015

(86) PCT No.: PCT/JP2015/072738
§ 371 (c)(1),
(2) Date: Mar. 23, 2017

(87) PCT Pub. No.: WO2016/024585
PCT Pub. Date: Feb. 18, 2016

(65) Prior Publication Data
US 2017/0230653 A1    Aug. 10, 2017

(30) Foreign Application Priority Data
Aug. 14, 2014    (JP) .................................. 2014-165193

(51) Int. Cl.
*H04N 17/00*    (2006.01)
*G01M 11/00*    (2006.01)
(Continued)

(52) U.S. Cl.
CPC .......... *H04N 17/004* (2013.01); *G01M 11/00* (2013.01); *G02F 1/1368* (2013.01);
(Continued)

(58) Field of Classification Search
None
See application file for complete search history.

(56) References Cited

U.S. PATENT DOCUMENTS 5,757,193 A * 5/1998 Yu .......................... G01R 31/309
250/559.45
2016/0343278 A1 * 11/2016 Tsujita ..................... H01L 51/50

FOREIGN PATENT DOCUMENTS

JP    2005-503532 A    2/2005
JP    2006-505764 A    2/2006
(Continued)

OTHER PUBLICATIONS

Machine English Translation of JP2013004637 (Year: 2013).*
(Continued)

*Primary Examiner* — Douglas X Rodriguez
(74) *Attorney, Agent, or Firm* — Fenwick & West LLP

(57) ABSTRACT

To provide an inspection device and an inspection method which are capable of detecting a disconnection defect in an organic TFT array and/or evaluating a variation in the output properties and response speed of each organic TFT element. There are provided a device and a method of optically measuring the presence or absence of the accumulation of carriers in an organic semiconductor thin film which provides a channel layer of an organic TFT element. A source and a drain in each organic TFT are short-circuited to each other, a voltage is turned on and turned off in a predetermined period between this and a gate, and images before and after application of the voltage are captured in synchroni-
(Continued)

zation with the predetermined period while radiating monochromatic light, to obtain a differential image.

10 Claims, 12 Drawing Sheets

(51) Int. Cl.
| | | |
|---|---|---|
| G02F 1/1368 | (2006.01) | |
| G09F 9/00 | (2006.01) | |
| H01L 29/786 | (2006.01) | |
| H01L 29/808 | (2006.01) | |
| H01L 29/812 | (2006.01) | |
| H01L 27/28 | (2006.01) | |
| H01L 51/00 | (2006.01) | |
| G02F 1/1362 | (2006.01) | |
| H01L 51/05 | (2006.01) | |

(52) U.S. Cl.
CPC .............. *G09F 9/00* (2013.01); *H01L 27/283* (2013.01); *H01L 29/786* (2013.01); *H01L 29/808* (2013.01); *H01L 29/812* (2013.01); *H01L 51/0031* (2013.01); *G02F 2001/136254* (2013.01); *H01L 51/0508* (2013.01); *H01L 51/0541* (2013.01); *H01L 51/0545* (2013.01)

(56) References Cited

FOREIGN PATENT DOCUMENTS

| JP | 2007-073619 A | 3/2007 |
|---|---|---|
| JP | 2008-218957 A | 9/2008 |
| JP | 2009-069408 A | 4/2009 |
| JP | 2013-004637 A | 1/2013 |

OTHER PUBLICATIONS

European Extended Search Report, European Application No. 15832431.9, dated Mar. 2, 2018, 7 pages.
Matsui, H. et al., "Visualization of Accumulated Charge Density in Operating Organic Thin-Film Transistors," Applied Physics Letters, Nov. 30, 2009, pp. 223301-1-223301-3, vol. 95, No. 22.
PCT International Search Report (with English translation) and Written Opinion, International Application No. PCT/JP2015/072738, dated Nov. 17, 2015, 11 Pages.
Manaka, T., et al., "Charge modulated reflectance topography for probing in-plane carrier distribution in pentacene field-effect transistors," Applied Physics Letters, 2010, p. 200, vol. 97, No. 11.
Manaka, T., et al., "Evaluation of Carrier Density in Organic Field-Effect Transistor by Charge Modulated Spectroscopy," Japanese Journal of Applied Physics, 2011, p. 04DK12, vol. 50.
Tsutsumi, J., et al., "Gate-modulation imaging of organic thin-film transistor arrays: Visualization of distributed mobility and dead pixels," Organic Electronics, 2015, pp. 289-294, vol. 25.

\* cited by examiner (a) (SCALE: LENGTH AND WIDTH 1 mm)

(b) (SCALE: LENGTH AND WIDTH 1 mm)

(c) (SCALE: LENGTH AND WIDTH 1 mm)

TRANSMITTANCE CHANGE REGION

INSPECTING ORGANIC TFT ARRAY USING DIFFERENTIAL IMAGE

TECHNICAL FIELD

The present invention relates to an organic semiconductor thin film transistor (TFT) array inspection device and an inspection method, and particularly relates to an inspection device and an inspection method which are capable of detecting a disconnection defect in an array and evaluating a variation in the output properties and response speed of each TFT element.

BACKGROUND ART

As an image display device such as a liquid crystal display or an organic EL display, a thin film transistor array (hereinafter, called a "TFT array") using an organic semiconductor is used. Such a TFT array has a circuit structure formed by lining up a plurality of organic TFT elements in a matrix in association with pixels of an image display device. Here, in a case where a short circuit or a disconnection of a gate line G or a signal line S, or a defect due to a defective organic semiconductor thin film occurs, a corresponding organic TFT element does not operate normally, and is set to be in a state of so-called pixel omission in which pixels do not emit light. In addition, in a case where a variation in output properties or response speed is present in each TFT element constituting the TFT array, stable moving image display is not available.

Consequently, it is necessary to inspect a disconnection defect of the TFT array, or a variation in the output properties or response speed of each TFT element. As such an inspection method, a method of electrically measuring each element, an imaging method using infrared thermography, or the like has been known.

For example, Patent Documents 1 and 2 disclose an inspection method in which in an field emission display (FED) or liquid crystal display (LCD) panel, a signal line S is grounded, an appropriate direct-current voltage is supplied to a gate line G, and an image thereof is captured using an infrared camera. In a case where the signal line S and the gate line G are short-circuited to each other, infrared rays are radiated due to heat generation in the corresponding portion. Therefore, capturing the image thereof, using an infrared camera, allows to detect a radiant point, that is, a short circuit position.

In addition, a method is also considered which is intended to detect the light-emitting state of each TFT element, and to inspect not only a disconnection defect of the TFT array but also output properties or the like of each TFT element.

For example, Non-Patent Documents 1 and 2 describe that in an organic semiconductor thin film which provides a channel layer of an organic TFT element, light transmittance and optical reflectance change very slightly in a state where carriers are accumulated with application of a gate voltage, and a state where carriers are depleted without applying the gate voltage, and the amount of change is proportional to the amount of carriers accumulated, that is, an output current. It is considered that using such a phenomenon allows not only to detect a disconnection defect in the TFT array, but also to evaluate a variation in the output properties or response speed of each TFT element.

RELATED DOCUMENTS

Patent Documents

[Patent Document 1] PCT Japanese Translation Patent Publication No. 2005-503532

[Patent Document 2] PCT Japanese Translation Patent Publication No. 2006-505764

Non-Patent Documents

[Non-Patent Document 1] T. Manaka, S. Kawashima, M. Iwamoto: "Charge modulated reflectance topography for probing in-plane carrier distribution in pentacene field-effect transistors", Appl. Phys. Lett. Vol. 97, Article No. 113302 (2010)

[Non-Patent Document 2] T. Manaka, S. Kawashima, M. Iwamoto: "Evaluation of Carrier Density in Organic Field-Effect Transistor by Charge Modulated Spectroscopy", Jpn. J. Appl. Phys. 50 (4), 04DK12 (2011)

SUMMARY OF THE INVENTION

Images of the TFT array are captured before and after a state where all signal lines S of a TFT array are grounded and an appropriate direct-current voltage is applied to a gate line G, to acquire a difference between both images. A differential image appears in a TFT element having carriers accumulated therein with application of a gate voltage. On the other hand, when a disconnection occurs in the signal line S or the gate line G, or the organic semiconductor thin film of a TFT element is defective, a corresponding TFT element does not have carriers accumulated therein, and has no differential image appearing. According to this, it is possible to detect the aforementioned disconnection or the like. In addition, a variation in the output properties of each TFT element is reflected in the amount of carriers accumulated, and thus appears as a difference between differential images of each TFT element. On the other hand, differential images due to the accumulation of carriers are fine, and thus it is very difficult to make discrimination therebetween.

The present invention is contrived in view of such circumstances, and an object thereof is to provide an inspection device and an inspection method which are capable of optically measuring the presence or absence of the accumulation of carriers in an organic semiconductor thin film provides a channel layer of an organic TFT element, detecting a disconnection defect in a TFT array, and/or evaluating a variation in the output properties and response speed of each TFT element.

The present invention is to acquire a differential image due to the accumulation of carriers in a TFT element, using charge modulation spectroscopy (CMS) imaging, detect a disconnection defect in a TFT array, and/or evaluate a variation in the output properties and response speed of each TFT element.

That is, a method of optically capturing and inspecting an organic semiconductor thin film transistor (TFT) array, according to the present invention, includes short-circuiting a source and a drain in each organic TFT, turning on and turning off a voltage at a predetermined period between this and a gate, and capturing images before and after application of a voltage in synchronization with the predetermined period while radiating monochromatic light, to obtain a differential image.

According to the invention, the predetermined period modulation under radiating of the monochromatic light, and the image capture with reducing a noise level, enables to acquire a differential image with high sensitivity, and to accurately detect a disconnection defect in the TFT array.

The above-described invention may include a step of integrating a plurality of the differential images. According to the invention, a contrast between the differential images can be increased to accurately detect a disconnection defect in the TFT array.

The above-described invention may include a step of inspecting an individual difference between each organic TFT from a contrast difference between the differential images for each portion corresponding to the organic TFT. According to the invention, accurate evaluation is possible of a variation in the output properties of each TFT element.

The above-described invention may include a step of changing the predetermined period and obtaining the differential image, and inspecting a response speed difference between each organic TFT. It may further include a step of starting the image capture after a lapse of a predetermined time from each of turn-on and turn-off of the voltage, changing the predetermined time and obtaining the differential image, and inspecting a response speed difference between each organic TFT. According to the invention, accurate evaluation is possible of a variation in the response speed of each TFT element.

An inspection device that optically captures and inspects an organic semiconductor thin film transistor (TFT) array, according to the present invention, includes: a function generator that short-circuits a source and a drain in each organic TFT and turns on and turns off a voltage at a predetermined period between this and a gate; a light source that radiates monochromatic light; an image capture device that captures images before and after application of a voltage in synchronization with the predetermined period; and an image analysis device that obtains differential images before and after application of the voltage.

According to the invention, the predetermined period modulation under radiating of the monochromatic light, and the image capture with reducing a noise level, enables to acquire a differential image with high sensitivity, and to accurately detect a disconnection defect in the TFT array.

In the above-described invention, the image analysis device may include an integration unit that integrates a plurality of the differential images. According to the invention, a contrast between the differential images can be increased to accurately detect a disconnection defect in the TFT array.

In the above-described invention, the image analysis device may include an individual difference inspection unit that inspects an individual difference between each organic TFT from a contrast difference between the differential images for each portion corresponding to the organic TFT. According to the invention, accurate evaluation is possible of a variation in the output properties of each TFT element.

In the above-described invention, it may include a control unit that causing the function generator to change the predetermined period to provide the differential image, and the image analysis device may include a response speed difference inspection unit that inspects a response speed difference between each organic TFT. In addition, it may include a control unit that starts the image capture after a lapse of a predetermined time from each of turn-on and turn-off of the voltage to provide the differential image, and the image analysis device may include a response speed difference inspection unit that inspects a response speed difference between each organic TFT. According to the invention, accurate evaluation is possible of a variation in the response speed of each TFT element.

DESCRIPTION OF EMBODIMENTS

Hereinafter, a method of inspecting a TFT array according to one example of the present invention will be described. First, a description will be given of the detection of a disconnection defect in the TFT array based on charge modulation spectroscopy imaging, and/or the evaluation of a variation in the output properties or response speed of each TFT element.

Figure 1:
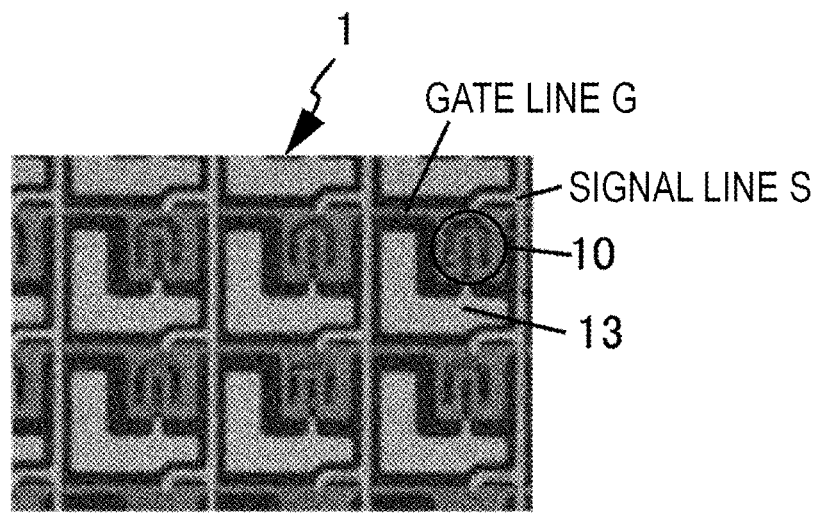
FIG. 1 is a plan view of a TFT array.
Figure 2:
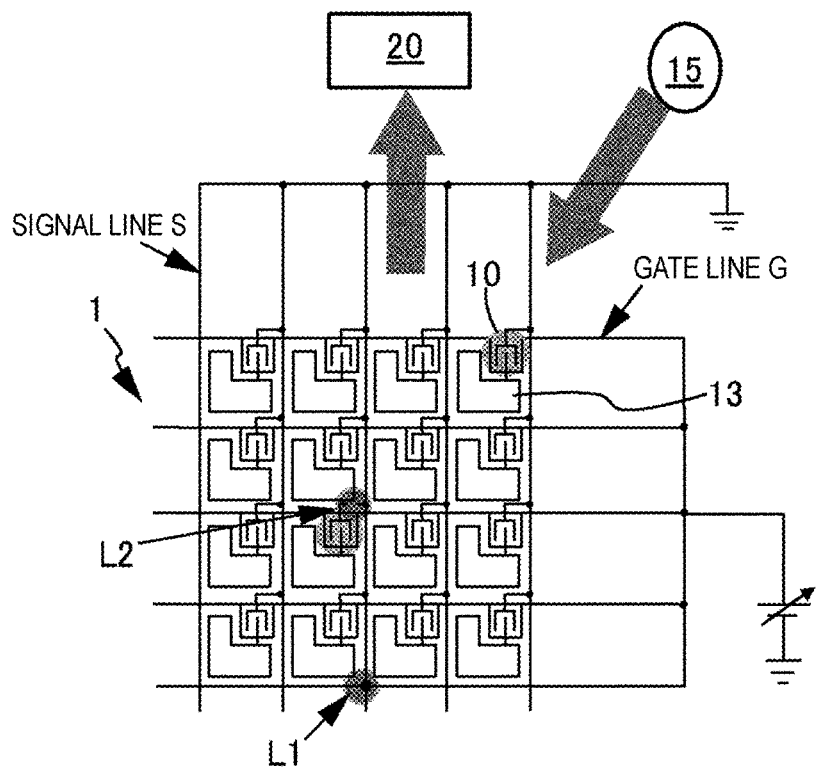
FIG. 2 is a circuit diagram illustrating the TFT array.
Figure 8:
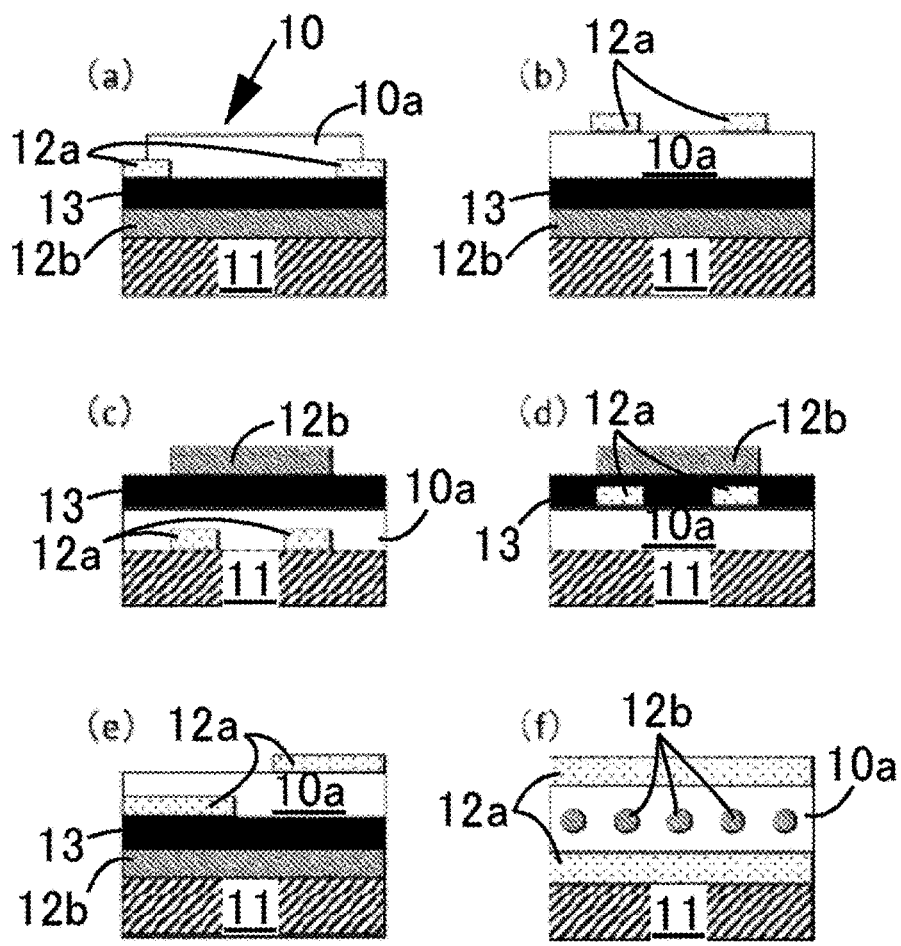
FIG. 8 is a cross-sectional view illustrating of a structure of an organic TFT.

As shown in FIGS. 1 and 2, a TFT array 1 includes organic TFT elements 10 corresponding to the number of pixels. A gate line G or a signal line S is electrically connected to an organic semiconductor thin film 10a (see FIG. 8) of each of the organic TFT elements 10. Here, in a case where a defect such as a short circuit L1 or a disconnection L2 is present in the organic semiconductor thin film 10a, the gate line G, or the signal line S, an organic TFT element 10 relevant thereto does not operate, and thus a corresponding pixel is not able to be caused to emit light.

As shown in FIG. 2, in a state where all the signal lines S of the TFT array 1 are grounded, and a voltage is applied and is not applied to the gate line G, images of the TFT array 1 are captured by a camera 20 while light is radiated from a light source 15. In a case where a difference between the images before and after the application of this voltage is taken, a differential (CMS) image appears only in a TFT element 10 having carriers accumulated therein by applying a voltage to the gate line G. If a disconnection (for example, L2) or a defect (for example, L1; "short circuit" herein) is generated in any one of the gate line G, the signal line S, and the organic semiconductor thin film 10a (see FIG. 8), carriers are not accumulated in a corresponding TFT element 10, and a differential image does not appear. That is, in this method, a defect is specified from a region in which a differential image does not appear.

In addition, since the intensity of a contrast of the TFT element 10 appearing a differential image is proportional to the amount of carriers accumulated (that is, output current), comparing the intensities of contrasts of the respective TFT elements 10 allows to evaluate a variation of an output current between the respective TFT elements 10 included in the TFT array 1.

In addition, in a CMS imaging method, a defect is detected using a slight change in the light transmittance and/or reflectance of the organic semiconductor thin film 10a (see FIG. 8) in the accumulation state and depletion state of carriers. The change rate of the light transmittance and reflectance is proportional to the amount of carriers accumulated. In the driving conditions of a general TFT element, this change rate is as very low as appropriate $10^{-3}$, and an integration process is used in order to detect such a change rate.

For example, Non-Patent Document 1 mentioned above states that in a case where carriers having a concentration of $4\times10^{12}$ cm$^{-2}$ are accumulated in an organic semiconductor layer (pentacene) using a silicon oxide film (having a permittivity of 3.8 and a thickness of 100 nm) as a gate insulating film, the change rate of reflectance is $4\times10^{-3}$. In a TFT array using a polymer that is able to be deposited by an application process as a gate insulating film, for example, in a case where CYTOP (made by Asahi Glass Co., Ltd., and having a permittivity of 1.9 and a thickness of 1 μm) of a fluorine-based polymer is used, the amount of carriers accumulated is approximately 1/10 ($4\times10^{11}$ cm$^{-2}$) of Non-Patent Document 1, and the change rate thereof further decreases as much as $4\times10^{-4}$.

Figure 3:
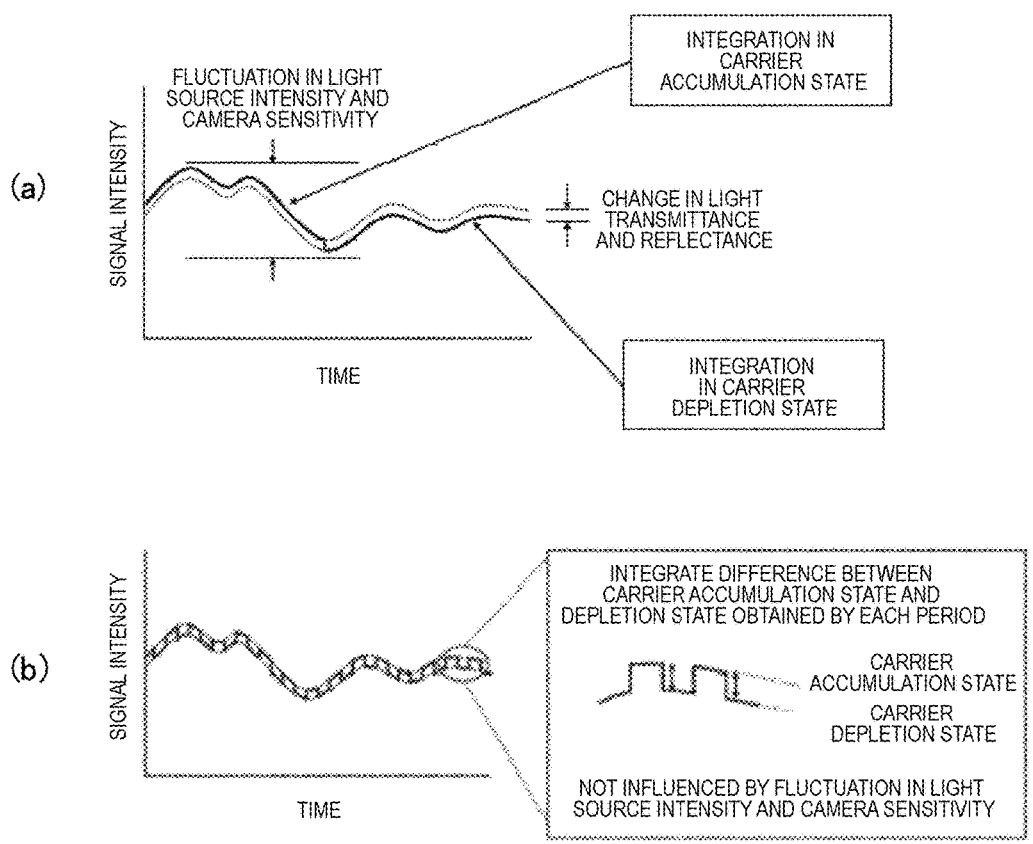
FIG. 3 is a diagram illustrating a CMS imaging method.

Incidentally, as shown in FIG. 3(a), the signal intensity of an image which is obtained by the CMS imaging method includes a temporal fluctuation in the intensity of the light source 15 or the sensitivity of the camera 20. In a case where the change rate of light transmittance and/or reflectance attempted to be detected is an order of $10^{-4}$, it is smaller than this fluctuation, and thus is not able to be detected due to cancellation by the temporal fluctuation even when images are integrated in the accumulation state and depletion state of carriers to take a difference between these images.

On the other hand, as shown in FIG. 3(b), in the CMS imaging method, switching (modulation) between the accumulation state and depletion state of carriers are repeated at a time scale shorter than the fluctuation of the intensity of the light source 15 or the camera 20, images of the accumulation state and depletion state of carriers are captured in each period to obtain a difference therebetween, and a differential image is integrated. Thereby, it is possible to eliminate the influence of the aforementioned fluctuation.

Modulation in the accumulation state and depletion state of carriers, that is, a state where a gate voltage is applied and a state where the voltage is released, as described later, may be performed using a function generator 30. Such a modulation frequency is 15 Hz to 1 MHz, and is more preferably 200 Hz to 1 MHz.

This is because a high modulation frequency is not likely to be influenced by the fluctuation of a low frequency, and the number of times of integration can be increased by increasing the number of times of image capture.

Further, in order to evaluate the response speed of the TFT element 10 based on a variable modulation frequency, it is preferable that measurement is performed by setting the modulation frequency of CMS imaging to be variable in a predetermined frequency range, for example, a range of 15 Hz to 1 MHz, more preferably 200 Hz to 1 MHz. In an moving image display as a display, a blur is felt in the human visual sense in a case where the speed of an element response becomes slower than 5 ms. Therefore, a defective element having a response speed slower than 5 ms is detected by setting the modulation frequency to be variable.

As an example, a case is considered in which only one element having a response speed of 10 ms (that is, in which the upper limit of a responsive frequency is 100 Hz) is mixed into the TFT array 1 constituted by organic TFT elements 10 having a response speed of 1 ms (that is, in which the upper limit of a responsive frequency is 1 kHz). In a case where the modulation frequency is equal to or lower than 100 Hz, all the TFT elements 10 appear in a differential image. On the other hand, in a case where it exceeds 100 Hz, a TFT element 10 having a response speed of 10 ms does not appear in the differential image. Further, in a case where it exceeds 1 kHz with increasing the frequency, all the TFT elements do not appear in the differential image. In this manner, it is possible to obtain a variation in the response speed of the TFT element 10 from a frequency which does not appear in the differential image.

In addition, the timings of turn-on and turn-off of a voltage and the timing of image capture may be set to be variable with respect to the evaluation of the response speed of the TFT element 10. Measurement is performed by arbitrarily delaying the start of image capture in a range of 1 ms to 100 ms, more preferably, 1 μs to 100 ms with respect to the start of each of the turn-on and turn-off of a voltage stated above.

Here, similarly to the above, a case is considered in which a TFT element 10 having a response speed of 10 ms is mixed into the TFT array 1 constituted by organic TFT elements 10 having a response speed of 1 ms.

Figure 4:
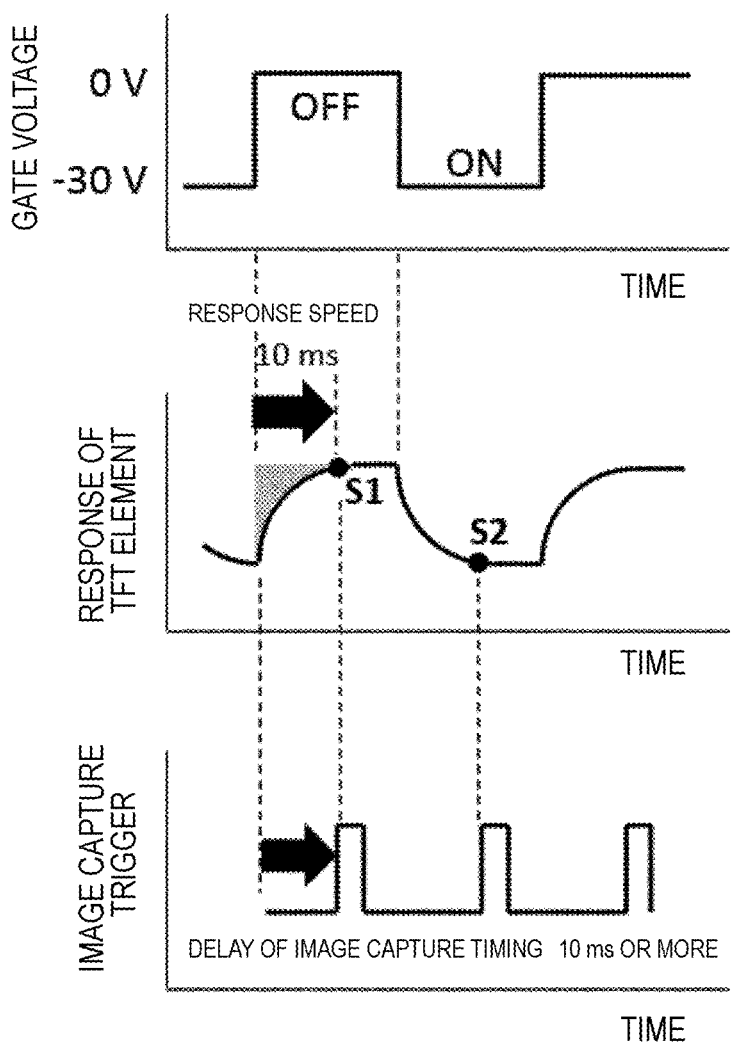
FIG. 4 is a timing diagram of a gate voltage, an image capture trigger, and a response of an element.

For example, as shown in FIG. 4, in a case where the timing of image capture is made 10 ms or greater slower than the timing of each of the turn-on and turn-off of a voltage, all the TFT elements 10 appear in a differential image. In this case, a differential image (S2-S1) becomes a negative image.

Figure 5:
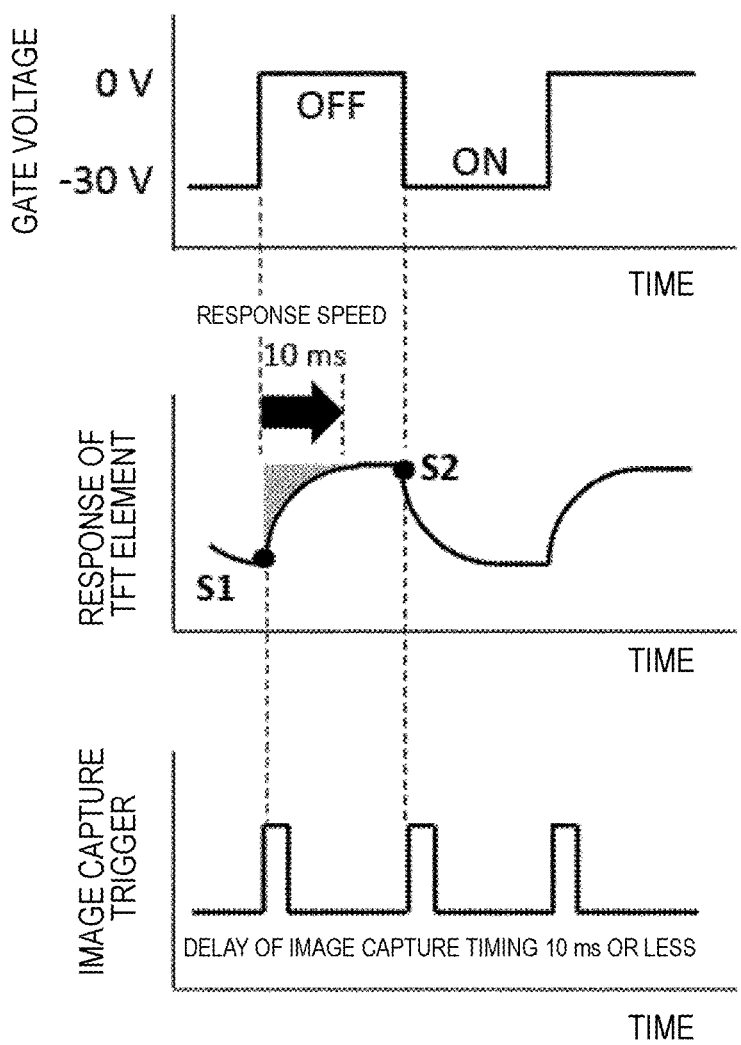
FIG. 5 is a timing diagram of a gate voltage, an image capture trigger, and a response of an element.

On the other hand, as shown in FIG. 5, in a case where the delay of a timing is set to be equal to less than 10 ms, the contrast of a CMS image is inverted in a TFT element 10 having a response speed of 10 ms. That is, the differential image (S2-S1) becomes a positive.

Further, although not shown in the drawings, in a case where the delay of a timing is set to be equal to or less than 1 ms, the contrast of the CMS image of all the TFT elements is inverted. In this manner, it is possible to obtain a variation in the response speed of the TFT element 10 from the delay of a timing at which the contrast of the differential image is inverted.

Here, in order to perform image capture in a high modulation frequency of 15 Hz to 1 MHz, more preferably, 200 Hz to 1 MHz, it is preferable that the camera 20 has a high frame rate, specifically, is a CCD of 30 fps to 2,000 fps, more preferably, 400 fps to 2,000,000 fps, or a CMOS camera. Meanwhile, it is preferable that such a camera 20 has as low a noise level as possible, a wide dynamic range, a wide wavelength region with a sensitivity, and a digital output of 16 bits or more. For example, PCO edge made by PCO AG, C11440-22CU made by Hamamatsu Photonics K.K., and BU-50LN made by BITRAN Corporation may be used.

Further, in a case where image capture is performed in a short period, it is necessary to reliably transmit image data to a computer which is an information processing unit, and it is desirable to use a buffer memory capable of rapidly saving an image at the same speed as the speed of image capture, for example, a buffer memory capable of saving thirty images for one second in a case of 30 fps.

Further, the change rate of the light transmittance and reflectance of the organic semiconductor thin film 10a (see FIG. 8) due to the accumulation of carriers changes depending on a wavelength region.

Figure 6:
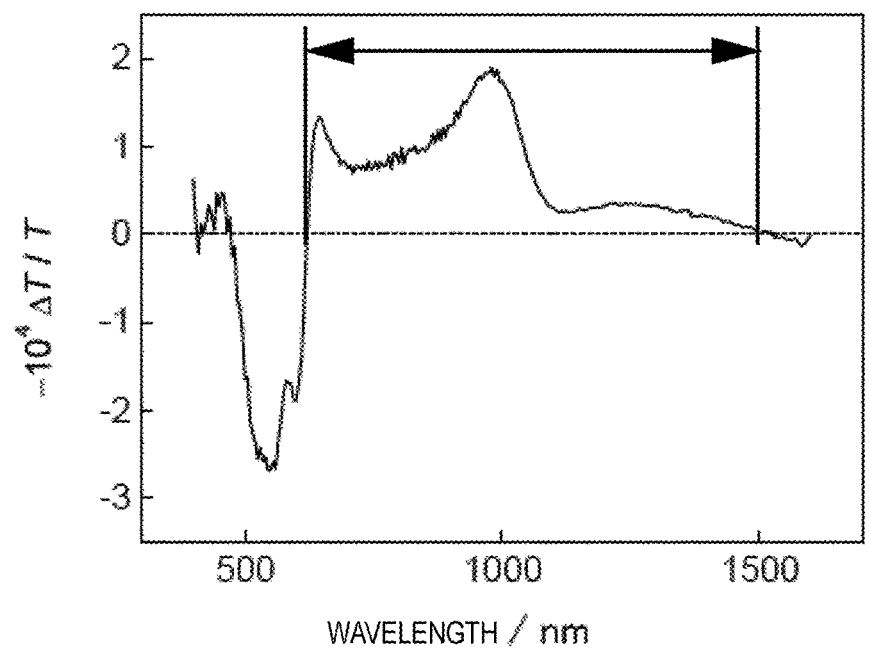
FIG. 6 is a graph illustrating wavelength dependence of a change rate ($-\Delta T/T$) of light transmittance in an organic semiconductor film.

As shown in FIG. 6, for example, the change rate ($-\Delta T/T$) of the light transmittance of P3HT [poly(3-hexylthiophene-2,5-diyl)] greatly changes the sign and absolute value of light transmittance in dependence on a wavelength region. Therefore, for example, a change is not able to be detected in a case where monochromatic light of 1,500 nm is radiated thereto, and an offset is caused due to positive and negative changes in a case where white light having light intensity in a wavelength range of 300 to 1,000 nm is radiated. Consequently, the light source 15 has light used therein which is obtained by spectroscopically dispersing white light from a halogen lamp or a xenon lamp through a bandpass filter, a color glass filter, a spectroscope, or the like. Alternatively, the light source 15 has a laser of a specific wavelength used therein, to perform measurement by radiating only light of a wavelength region having a large absolute value of $-\Delta T/T$, for example, light of a wavelength region of 630 to 1,500 nm.

Next, a method of estimating a position of a disconnection defect from a differential image will be described.

Figure 7:
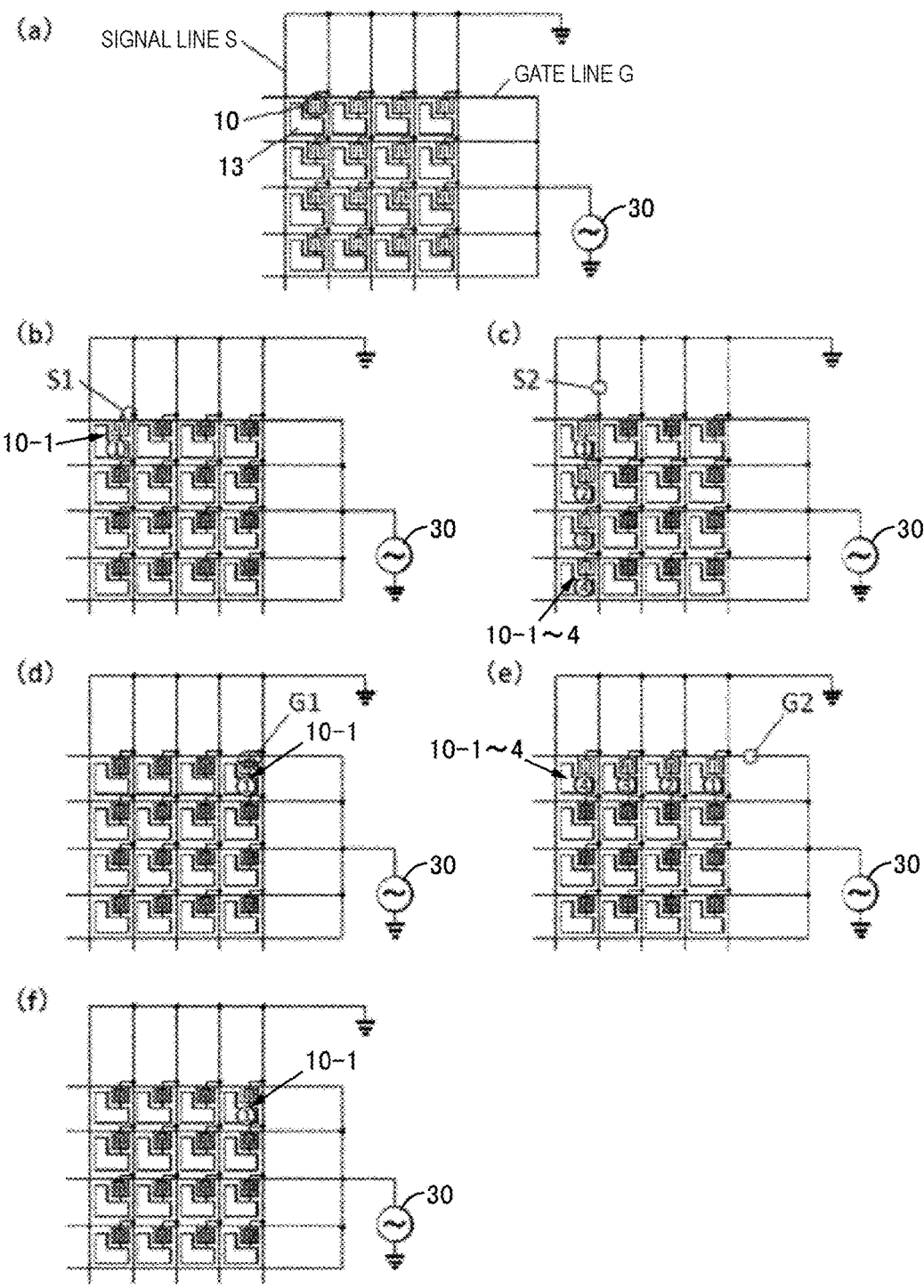
FIG. 7 is a diagram illustrating a circuit diagram and its state.

As shown in FIG. 7(a), a signal line S and a gate line G in a range suspected to have a defect are short-circuited to each other, and a voltage is periodically applied therebetween using the function generator 30. As shown in FIG. 7(b), in a case where the position S1 of the signal line S is disconnected, differential images of all the TFT elements 10 except a TFT element 10-1 appear. In addition, as shown in FIG. 7(c), in a case where the position S2 of the signal line S is disconnected, all the TFT elements 10 except the columns of TFT elements 10-1 to 4 appear in the differential images.

In addition, as shown in FIG. 7(d), in a case where the position G1 of the gate line G is disconnected, all the TFT elements 10 except the TFT element 10-1 appear in the differential images. As shown in FIG. 7(e), in a case where the position G2 of the gate line G is disconnected, all the TFT elements 10 except the column of the TFT elements 10-1 to 4 appear in the differential images. In addition, as shown in FIG. 7(f), in a case where the TFT element 10-1 does not have the organic semiconductor thin film 10a (see FIG. 8) or does not electrically contact the signal line S and/or the gate line G even when the organic semiconductor thin film 10a is present, all the TFT elements 10 except the TFT element 10-1 appear in the differential images.

Meanwhile, as shown in FIGS. 8(a) to 8(f), the structure of the TFT element is provided with the organic semiconductor thin film 10a, a source and drain electrode 12a, a gate electrode 12b, and a gate insulating film 13 on a substrate 11. There are (a) BGBC: bottom gate bottom contact, (b) BGTC: bottom gate top contact, (c) TGBC: top gate bottom contact, (d) TGTC: top gate top contact, (e) BG-T&BC: bottom gate—top & contact, (f) electrostatic induction type, and the like.

What is capable of CMS imaging using reflected light among these components is limited to components in which the organic semiconductor thin film 10a is exposed on the outermost surface of the TFT element. That is, FIGS. 8(a), 8(b), and 8(e) correspond thereto.

On the other hand, the CMS imaging using transmitted light may be applied to every type. However, in a case of FIGS. 8(a), 8(b), 8(c), 8(d), and 8(e), the substrate 11, the gate electrode 12b, and the gate insulating film 13 have to be semi-transparent (preferably, transparent) to irradiation light. Therefore, the gate electrode 12b has to be a transparent conductive film such as indium tin oxide (ITO) or poly(3,4-ethylene dioxythiophene):poly(styrene sulfonate) (PEDOT: PSS), or an extremely thin and semi-transparent metal thin film. In addition, the gate insulating film 13 has to be a transparent insulating film such as poly(methyl methacrylate) (PMMA), CYTOP (made by Asahi Glass Co., Ltd.), TEFLON-AF (made by DuPont), or parylene. Further, the substrate 11 has to be a transparent substrate such as glass, quartz glass, polypropylene (PP), polyethylene (PE), polyethylene terephthalate (PET), polycarbonate (PC), or polyimide (PI). Meanwhile, in a case of FIG. 8(f), the source electrode and drain electrode 12a has to be a transparent conductive film such as ITO or PEDOT: PSS, or an extremely thin and semi-transparent metal thin film.

Next, an example of inspection will be described.

Example

Figure 9:
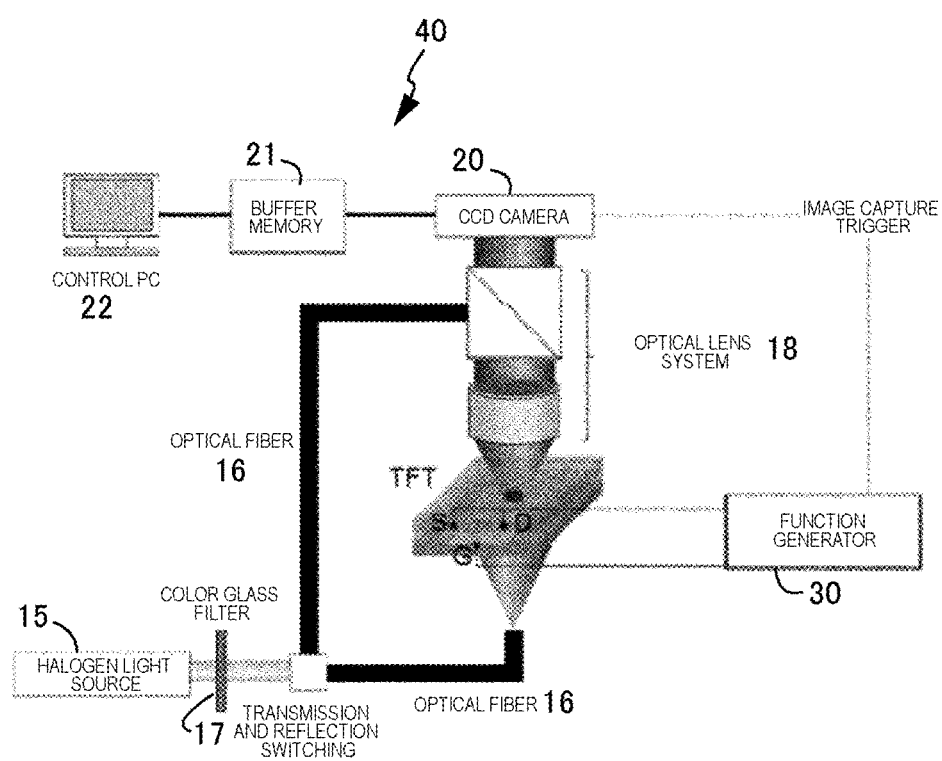
FIG. 9 is a diagram illustrating a device according to the present invention.

As shown in FIG. 9, a CMS imaging device 40 as an inspection device is constituted by a halogen light source 15, an optical fiber 16, a color glass filter 17, an optical lens system 18, a CCD camera (monochrome) 20, a buffer memory 21 that temporarily saves a captured image of a CCD camera, a control PC 22, and a function generator 30. Both a reflective image and a transmissive image can be captured by switching of an optical system.

The CCD camera 20 has sensitivity in a wavelength range of 300 to 1,100 nm, a frame rate of 30 fps, and a digital output of 16 bits.

The buffer memory 21 can rapidly save an image at the same speed as the image capture speed of the camera 20, and has a capacity of 4 GB.

The organic thin film transistor 10 used herein is a BGBC type, and is fabricated as follows with appropriate reference to FIG. 8(a). That is, chromium of 0.3 nm is evaporated on the quartz glass substrate 11 having a square of 10 mm as an adhesion layer, and then gold and aluminum of 6 nm and 1 nm, respectively, are evaporated, to form the semi-transparent gate electrode 12b. CYTOP (made by Asahi Glass Co., Ltd.) of a fluorine-based polymer of 400 nm is provided thereon as the gate insulating film 13 by spin coating, and is heated for 30 minutes at 120 degrees to vaporize a solvent. Next, chromium of 0.3 nm is evaporated as an adhesion layer, and then gold of 30 nm is evaporated, to form the source and drain electrode 12a. Further, a solution of 15 μl having P3HT of a polymer type semiconductor dissolved in trichlorobenzene (concentration of 0.1 wt %) is dropped under a nitrogen atmosphere, it is uniformly wet and spread by covering a sheet of polydimethylsiloxane (PDMS) from thereon, and the PDMS sheet is peeled off after the PDMS sheet has absorbed trichlorobenzene, to thereby form the organic semiconductor thin film 10a constituted of uniform P3HT. Lastly, the organic semiconductor thin film is heated for 30 minutes at 100 degrees. Two types of organic TFT element 10 of a single element and TFT array 1 constituted by 5×5 TFT elements 10 are fabricated by such a procedure.

CMS Imaging Measurement

CMS imaging measurement is performed in the next procedure. That is, as shown in FIG. 9, the TFT array 1 or the organic TFT element 10 (unless otherwise noted, simply called an "organic TFT element 10" for the sake of convenience) is disposed in front of the optical lens system 18, the optical lens system 18 is adjusted to focus on the organic semiconductor thin film 10a of the organic TFT element 10, and light from the halogen light source 15 is radiated from the back side of the organic TFT element 10. In this case, as shown in FIG. 6, since P3HT has the sign of $-\Delta T/T$ reversed with a wavelength of 620 nm set to a boundary, only near-infrared light of 630 nm or more is radiated using the color glass filter 17, in order to prevent the offset of $-\Delta T/T$.

Figure 10:
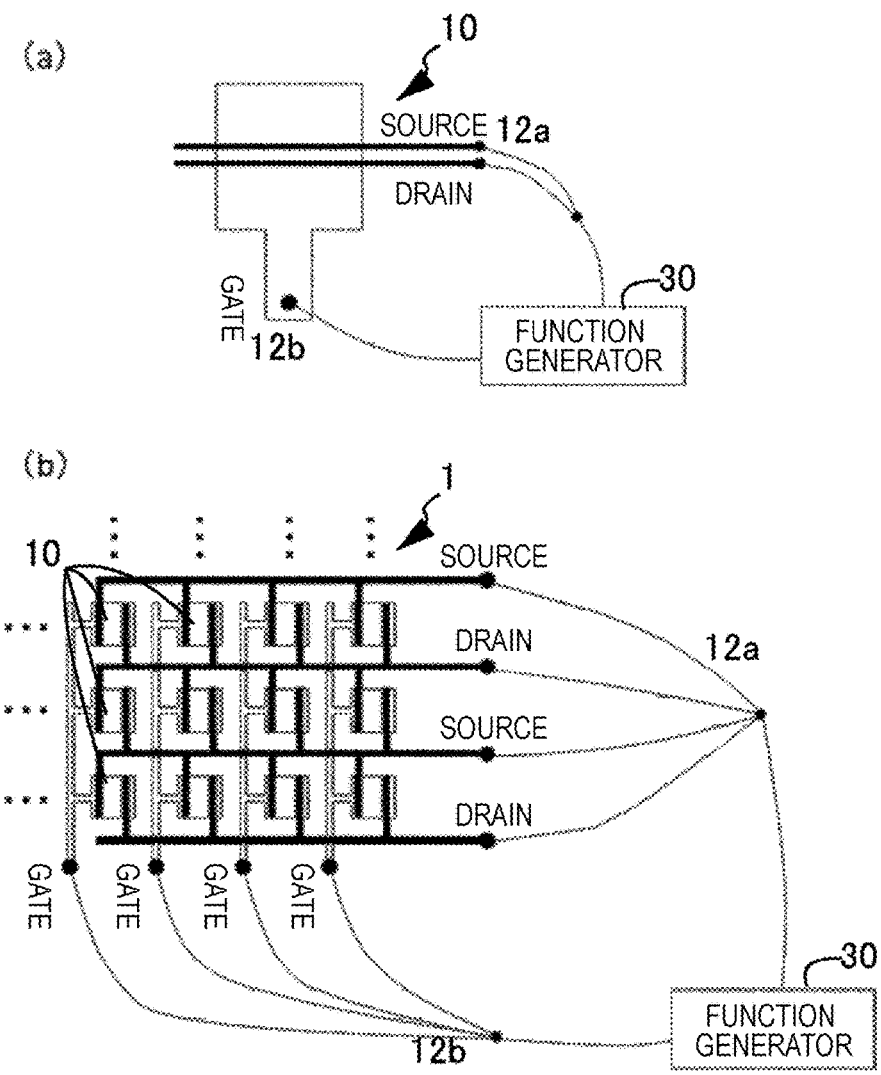
FIG. 10 is a diagram illustrating a connection state of the organic TFT.

Next, as shown in FIG. 10(a), in a case of the single organic TFT element 10, a source and a drain are short-circuited to each other, and voltages of −30 V and 0 V are applied between the electrode 12a and the gate electrode 12b at a repetition period of 15 Hz using the function generator 30. Thereby, a carrier accumulation state (carrier density=8× $10^{11}$ cm$^{-2}$) and a carrier depletion state are repeatedly generated.

On the other hand, as shown in FIG. 10(b), in a case of the 5×5 TFT array 1, voltages of −30 V and 0 V are applied between the electrodes 12a having the sources and drains of all the TFT elements 10 short-circuited to each other and the electrodes 12b having the gates of all the TFT elements 10 short-circuited to each other, at a repetition period of 15 Hz using the function generator 30.

Figure 11:
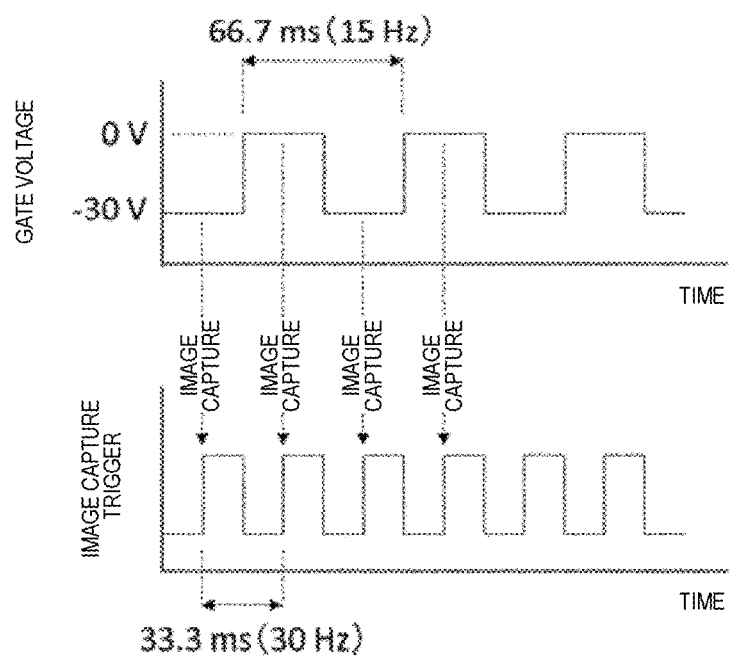
FIG. 11 is a diagram illustrating a repetition period of a gate voltage and an image capture trigger.

As shown in FIG. 11, a trigger of a repetition period (30 Hz) twice as high as a gate voltage is input from the function generator 30 to the CCD camera 20, and image capture is performed in each state where the gate voltage is −30 V and 0 V. An exposure time is set to 1 ms.

Images captured in each period are saved in the buffer memory 21, and after finishing measurement, the images of the buffer memory 21 are transmitted to the PC 22. A difference between the images, captured in each period, in each state where the gate voltage is −30 V and 0 V is taken on the PC 22, and a differential (CMS) image is obtained by integrating and averaging the difference over the entire period.

Figure 12:
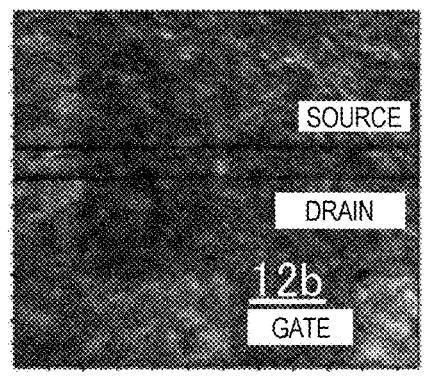
FIG. 12 is a captured image of the TFT array according to a method of the present invention.
Figure 12:
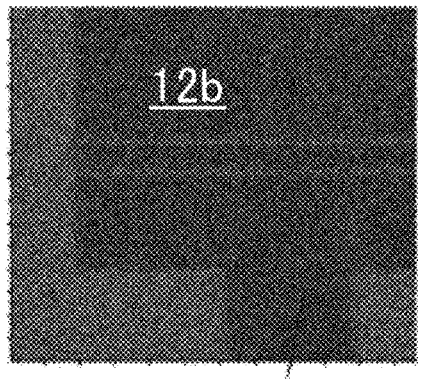
Figure 12:
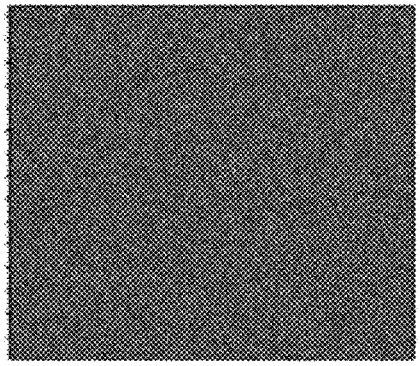

FIG. 12(a) illustrates an optical microscope image of the TFT element 10, and FIG. 12(b) illustrates a differential image obtained by ten minutes of image integration. A change in transmittance due to accumulated carriers is seen only on the gate electrode 12b. This is because carriers are accumulated in only the organic semiconductor thin film 10a located above the gate electrode 12b.

Meanwhile, FIG. 12(c) illustrates a differential image in a case where an output voltage from the function generator 30 is made lower (difference between images in a state where the gate voltage is −0.01 V and 0 V). It is possible to confirm that the accumulated carriers can be detected in FIG. 12(b) from the disappearance of a contrast.

Figure 13:
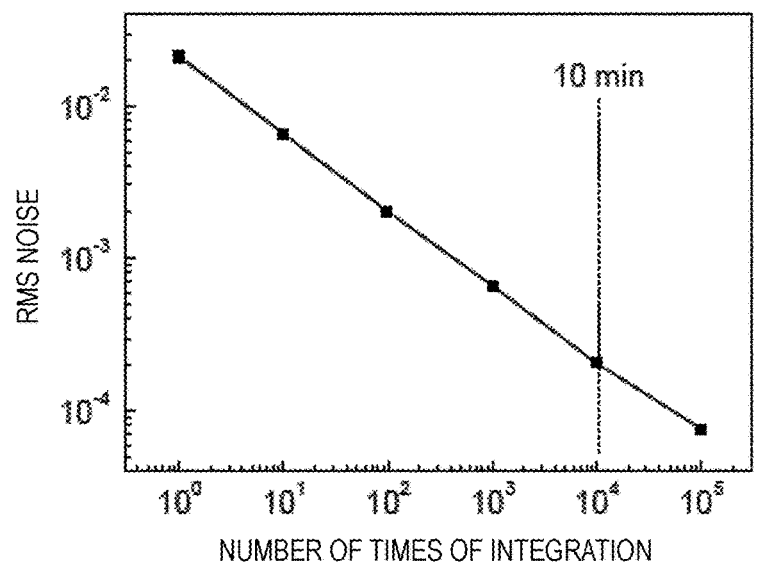
FIG. 13 is a graph illustrating RMS of the captured image of the TFT array according to the method of the present invention.

Further, as shown in FIG. 13, RMS noise of the differential image decreases as the number of times of integration is increased, and decreases to $2 \times 10^{-4}$ in ten minutes or more of integration. This means that the change rate $-\Delta T/T$ of light transmittance of an order of $10^{-4}$ can be detected in about ten minutes of integration.

In such an example, measurement is performed in a repetition period of 15 Hz. However, measurement performed in an shorter repetition period allows to obtain a clear differential image in a shorter time.

Figure 14:
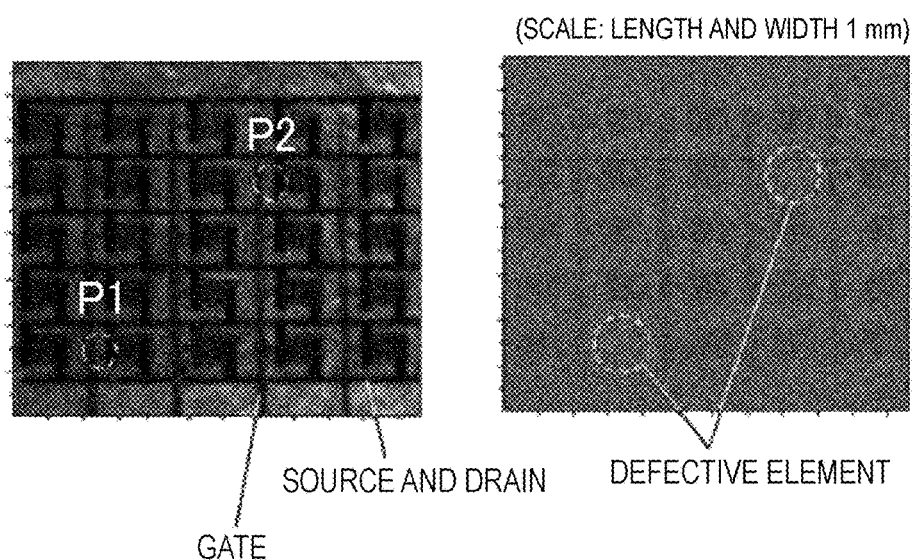
FIG. 14 is an optical microscope image of the TFT array and a captured image according to the method of the present invention.

FIG. 14(a) illustrates an optical microscope image of the 5×5 TFT array 1, and FIG. 14(b) illustrates a differential image obtained by ten minutes of image integration. The differential image does not appear in two TFT elements 10 of P1 and P2. This means that defects are present in such two TFT elements 10. In fact, disconnections are present in a gate interconnect in two TFT elements 10 from the optical microscope image of FIG. 14(a).

As described above, use of the imaging device 40 allows to rapidly detect a disconnection defect with respect to not only the TFT element 10, but also the TFT element 10 included in the TFT array 1.

In the present example, even in a case of low density of accumulated carriers, for example, an order of $10^{11}$ cm$^{-2}$, it is possible to detect the TFT element 10 having a defect at high speed and high sensitivity, with respect to the TFT array 1. Further, it is also possible to image a variation in the output properties and response speed of each TFT element 10 constituting the TFT array 1.

As stated above, the examples of the present invention and the modification examples based thereon have been described, but the present invention is not necessarily limited thereto, and those skilled in the art would be able to find various alternative examples and modification examples without departing from the gist of the present invention or the scope of the appended claims.

REFERENCE NUMERALS

1: TFT array
10: organic TFT element
10a: organic semiconductor thin film
12a: source and drain electrode
12b: gate electrode
13: gate insulating film
15: light source
16: optical fiber
17: color glass filter
18: optical lens system
20: camera
21: buffer memory
22: computer
30: function generator

The invention claimed is:

1. A method of inspecting an organic semiconductor thin film transistor (TFT) array, the method comprising:
   short-circuiting sources and drains in a plurality of organic TFTs by electrically connecting the sources and the drains during the inspecting of the organic semiconductor TFT array that includes the plurality of organic TFTs;
   turning on and turning off a voltage at a predetermined period between the sources short-circuited with the drains, and gates of the plurality of organic TFTs; and
   capturing a first image covering the plurality of the organic TFTs after the voltage between the sources short-circuited with the drains and gates of the plurality of organic TFTs is turned from off to on and a second image covering the plurality of organic TFTs after the voltage between the sources short-circuited with the drains and gates of the plurality of organic TFTs is turned from on to off in synchronization with the predetermined period while radiating monochromatic light, to obtain a differential image representing differences between the first image and the second image, the differential image covering the plurality of the organic TFTs.

2. The method of inspecting an organic TFT array according to claim 1, further comprising a step of integrating the differential image with one or more other differential images to obtain an integrated differential image.

3. The method of inspecting an organic TFT array according to claim 2, further comprising a step of inspecting an individual difference between each organic TFT from a contrast difference between the integrated differential image for each portion corresponding to the organic TFT.

4. The method of inspecting an organic TFT array according to claim 3, further comprising a step of changing the predetermined period and obtaining the differential image, and inspecting a response speed difference between each organic TFT.

5. The method of inspecting an organic TFT array according to claim 3, further comprising a step of starting the image capture after a lapse of a predetermined time from each of turn-on and turn-off of the voltage, and changing the predetermined time and obtaining the differential image, and inspecting a response speed difference between each organic TFT.

6. An inspection device that inspects an organic semiconductor thin film transistor (TFT) array by optically capturing images of the organic semiconductor TFT array, the device comprising:
  a function generator configured to short-circuit sources and drains of a plurality of organic TFTs in the organic semiconductor TFT array during inspecting of the organic semiconductor TFT array by electrically connecting the sources and the drains, and configured to turn on and turn off a voltage at a predetermined period between the sources short-circuited with the drains, and gates of the plurality of organic TFTs;
  a light source that radiates monochromatic light;
  an image capture device that captures a first image covering the plurality of the organic TFTs after the voltage between the sources short-circuited with the drains and gates of the plurality of organic TFTs is turned from off to on, and a second image covering the plurality of organic TFTs after the voltage between the sources short-circuited with the drains and gates of the plurality of organic TFTs is turned from on to off in synchronization with the predetermined period; and
  an image analysis device that obtains a differential image representing differences between the first image and the second image, the differential image covering the plurality of the organic TFTs.

7. The organic TFT array inspection device according to claim 6, wherein the image analysis device includes an integration unit that integrates the differential image with one or more other differential images to obtain an integrated differential image.

8. The organic TFT array inspection device according to claim 7, wherein the image analysis device includes an individual difference inspection unit that inspects an individual difference between each organic TFT from a contrast difference between the integrated differential image for each portion corresponding to the organic TFT.

9. The organic TFT array inspection device according to claim 8, further comprising a control unit that causes the function generator to change the predetermined period to provide the differential image,
  wherein the image analysis device includes a response speed difference inspection unit that inspects a response speed difference between each organic TFT.

10. The organic TFT array inspection device according to claim 8, further comprising a control unit that starts the image capture after a lapse of a predetermined time from each of turn-on and turn-off of the voltage to provide the differential image,
  wherein the image analysis device includes a response speed difference inspection unit that inspects a response speed difference between each organic TFT.

* * * * *